United States Patent
Langston et al.

(10) Patent No.: US 6,212,397 B1
(45) Date of Patent: Apr. 3, 2001

(54) METHOD AND SYSTEM FOR CONTROLLING REMOTE MULTIPOINT STATIONS

(75) Inventors: James L. Langston, Richardson; Michael F. Black, Garland; William K. Myers, McKinney; James S. Marin, Murphy; Douglas B. Weiner, The Colony, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/996,270

(22) Filed: Dec. 22, 1997

(51) Int. Cl.[7] .............. H04B 7/00; H04B 1/00; H04B 1/06; H04Q 7/00
(52) U.S. Cl. ............. 455/500; 455/68; 455/69; 455/92; 455/234.1
(58) Field of Search ................. 455/500, 446, 455/260, 72, 35.1, 20, 343, 265, 255.1, 71, 68, 61, 92, 234.1; 370/281; 375/200, 376

(56) References Cited

U.S. PATENT DOCUMENTS

| | | | |
|---|---|---|---|
| 3,970,965 | * | 7/1976 | Shapiro et al. ............... 327/528 |
| 4,034,296 | * | 7/1977 | Berenson et al. ............... 455/72 |
| 4,063,188 | * | 12/1977 | Mawhinney ................. 331/11 |
| 4,218,772 | * | 8/1980 | Sielman et al. ............... 455/20 |
| 4,466,130 | * | 8/1984 | Sewerinson ................. 455/260 |
| 4,479,256 | * | 10/1984 | Sewerinson ................. 455/265 |
| 4,541,118 | * | 9/1985 | Eastmond et al. ............ 455/35.1 |
| 5,133,081 | * | 7/1992 | Mayo ........................ 455/18 |
| 5,199,045 | * | 3/1993 | Kato ........................ 375/200 |
| 5,546,056 | * | 8/1996 | Tokumitsu .................. 331/172 |
| 5,548,811 | * | 8/1996 | Kumagai et al. ............. 455/192.2 |
| 5,566,366 | * | 10/1996 | Russo et al. ................ 455/343 |
| 5,619,491 | * | 4/1997 | Panzer ...................... 370/342 |
| 5,627,499 | * | 5/1997 | Gardner .................... 375/305 |
| 5,802,173 | * | 9/1998 | Hamilton-Percy et al. ..... 455/561 |
| 5,867,485 | * | 2/1999 | Chambers et al. ............ 370/281 |

FOREIGN PATENT DOCUMENTS 851 618 A2 * 1/1998 (EP) .................. H04H/1/00

* cited by examiner

Primary Examiner—Dwayne Bost
Assistant Examiner—Raymond B. Persino
(74) Attorney, Agent, or Firm—Robert L. Troike; Frederick J. Telecky, Jr.

(57) ABSTRACT

Multipoint Stations are controlled by one or more pilot tones broadcasted by a base station. The pilot tones are used to control the local oscillators of the remote stations both for receive and for transmit. The pilot tone is also used to control the input gain and the transmit gain of the remote station.

4 Claims, 5 Drawing Sheets

METHOD AND SYSTEM FOR CONTROLLING REMOTE MULTIPOINT STATIONS

TECHNICAL FIELD OF THE INVENTION

This invention relates to wireless point to multipoint communication systems and more particularly to pilot signal method for controlling remote stations.

BACKGROUND OF THE INVENTION

In a point-to-multipoint wireless communication system, a central station communicates throughout a coverage area with multiple remote stations. The remote station would be located somewhere within a node to communicate with a nodal transmitter receiver. A more complete description of such a system for example may be a point-to-multipoint system described by Langston application Ser. No. 08/345, 183, filed Nov. 30, 1994, entitled from "Low Power, Short Range Point-To-Multipoint Communications System." Referring to FIG. 1 from that application, there is illustrated the distribution system network 10. This network comprises a plurality of nodes, such as node 11 through 13 covering a given combined area. For example, this area may cover a few city blocks only, but with hundreds of such nodes the area may comprise an entire large city. A central office 15 would be, for example, the central message center or source of programming for distribution to the other nodes 11 through 13. Each of the nodes would include a nodal broadcast transmitter or transmitter and receiver system. This is represented by system 11a, 12a, and 13a in the center of the nodes 11 through 13. The transmission from the central office 15 to the nodal broadcast transmitter systems 11a, 12a, or 13a may be done by cabling in or around the city such as fiber optic telephone exchange cables represented here as cable 16 between the central office 15 and the node transmitter systems 11a, 12a, and 13a. This coupling may also be done using microwave antennas such as using antenna 17 from the central office 15 communicating with antennas 18 at the center of the nodes at the systems 11a, 12a, or 13a. This distribution may be implemented in a variety of other configurations well known in the state of the art.

Referring to FIG. 2, there is illustrated a sketch of a nodal broadcast transmitter or system 12a. In the case of microwave distribution from a central office, there is the microwave antenna represented schematically by 18. The nodal transmitter broadcast systems 11a and 13a are like system 12a illustrated in FIG. 2, but with the polarizations indicated in the sketches as +45° rotation and −45° (315°) rotation of FIG. 1. (Other orthogonal polarization may preferably be used, e.g., vertical and horizontal polarization). The system 12a includes a post 35 for supporting a four-quadrant sectorized antenna complex system represented by 12b. The system 12a includes a transmitter and receiver represented schematically by 21. Signals transmitted from system 12a are coupled from transmitter 21 to the nodal transmitter coverage or broadcast antenna system 12b comprised of four panel array antennas 31, 32, 33, and 34 via leads 22. The panel antennas 31–34 are mounted to post 35 via supports 22a housing transmission lines 22. Each of these panel antennas 31–34 comprises an array of transmitting antenna elements and receiving antenna elements as will be discussed in more detail later. Polarization of these antenna elements; 30 for antenna system 12b is such that panels 31 and 33 for system 12b transmit 45° slant polarized waves (marked +45° in FIG. 1), while panels 32 and 34 for system 12b transmit −45° (315°) slant polarized waves (marked −45° slant in FIG. 1). See FIG. 1.

These panel antennas, for example, produce a 90 degree beam width so that each of the panel antennas 31–34 covers approximately 90 degrees beam width and the polarization from these panel antennas 31–34 alternates from +45° slant polarization to −45° slant (315°) polarization to +45° slant polarization and then to −45° (315°) polarization about the center of the node on post 35. This, therefore, provides a 360 degree pattern about the center of the node where the node broadcast transmitter is located.

The adjacent nodes 11 and 13 on either side of node 12 present orthogonal polarization. For example, the panel antennas 31 and 33 in nodes 11 and 13 produce −45° (315°) polarized signals and the panel antennas 32 and 34 in nodes 11 and 13 produce +45° polarized signals. Therefore, at the adjacent sectors of the nodes, that is where node 11 is adjacent to node 12, the polarizations are orthogonal, and where node 12 meets node 13 the polarization is orthogonal. The node broadcast transmitting antennas systems 11b, 12b and 13b transmit and communicate with receiving stations 41 scattered in the area of the nodes.

Receiving station 41 may be located any-where in any of the nodes 11–13 and will receive the signal radiated from the antenna complex at the center of one of the nodes from the sectorized antenna system 20. The polarization of the receiving station 41 would determine which sector it is receiving from. For example, the receiving station 41a in FIG. 1 in node 12 would be in the +45° slant polarized sector and receive +45° slant polarized signals from the panel antenna 33 of system 12b. Station 41b in node 12 would receive preferably −45° (315°) slant polarized signals from the panel antenna 32 and not +45° polarized signals from panels 31 or 33 from system 12b or from panel 34 of system 11b. For the receiving antenna 41c, located in the overlapping area of the pattern of 32 and 33, it is possible to receive both +45° polarized signals from panel antenna 33 and −45° (315°) slant polarized signals from panel antenna 32. However, a signal received from the face which is of the wrong polarization from the antenna 41 would be 20 to 30 dB lower in power than the other face. For example, if the antenna of 41c was −45° (315°) polarized it would receive the signal from panel antenna (+45° polarized) 33 of system 12b from 20 to 30 dB down from that of the −45° (315°) polarized signal from antenna 32 of system 12b. Similarly, stations 41e and 41f at the edges of nodes 11 and 12 and 12 and 13, respectively, achieve similar isolation based on polarization. That is, station 41e with a −45° (315°) polarized antenna picks up signals from panel antenna 32 of system 12b. The signals from panel antenna 34 of system 11b are 20 to 30 dB lower than those from panel antenna 32 of system 12b. Again the system may preferably be with the receiver antennas polarized vertical and/or horizontal to match the nodal transmitting antennas.

The system is designed such that the signals from all four panels 31–34 are transmitting at the same carrier frequencies but may contain different information. The system is dependent upon space (different coverage areas) as well as frequency and polarization diversity.

The system, as described herein, utilizes a four-quadrant sectorized antenna. However the system could be of any even number of sectors such as two, four, eight, etc. The four-quadrant sectorized antenna discussed in FIG. 1 has an azimuth pattern relatively flat over a plus and minus 45 degrees from the center (90° beam width) which is easy to implement and is, therefore, more easily implemented, for example on a building or a tower for mounting panel antennas. An octagon, or eight sector, antenna system may be practical in some cases, but receivers located a line drawn to the corners will be able to see more than two panels and, hence, see signals having the same polarization. Thus, the four sector is the preferred embodiment where frequency re-use is required.

The transmission to and from the central office 15, as stated previously, may include a microwave network with the microwave dish 18 coupled to a transceiver via an up/down converter 18a. The received signals from the central office 15 are upconverted to millimeter waves and sent via the panel antennas and the received signals at the panel antennas are down converted to microwave frequencies and sent back to the central office 15 via antenna 18 or cables 16. (Other frequencies, e.g., millimeter frequency, may also be used to interconnect the nodes). This application is incorporated herein by reference.

Viewing a particular sector, for example, the base station BS or the node transmitter transmits over a given sector as represented within the dashed lines in FIG. 3. The subscriber or remote stations RS are represented by RS #1, RS #2, etc. in FIG. 3. The transmission from the node directional base station antennas BS in the system represents the down stream information and the signals from the remote stations RS represents the upstream signals in FIGS. 3–5.

At the high operating frequencies of the microwave systems, such as at the 27–30 GHz range, the accuracy of frequency setting devices becomes difficult to achieve. Microwave systems that use digital modulation must maintain good frequency tolerance. In a point-to-multipoint communication system, the remote station costs dominates the cost per subscriber. Remote stations need a low cost method for creating frequency reference.

For heterodyne receiver architectures, remote stations must have local oscillators with specific requirements on operating frequency and phase noise. For digitally modulated payload signals at microwave operating frequencies, the cost and complexity of local oscillators can add significantly to the cost of the remote stations. Normally, local oscillators create a signal on a specific frequency by using either a high-Q component such as a crystal or by synchronizing to a signal with a known frequency. High-Q component can be expensive, especially if oscillators use ovens to stabilize frequency drifts over the operating temperature range.

When multiple remote stations use closely spaced channels, errors in operating frequency can cause interference between the channels.

The signal strength at a remote station varies as a function of the distance between the base station and the remote station. Traditionally designers use automatic gain control (AGC) circuits to automatically adjust the gain of receivers and maximize the dynamic range of the payload signals. An AGC circuit requires a gain setting control signal that payload demodulators often create. Remote station wiring routes the control signal to a variable gain amplifier in the front end of the receiver and sets the gain at the receiver. However, in a physical configuration where the payload demodulator is remotely located from the front end of the receiver the control signal becomes expensive to route to the front end receives function. It is highly desirable to provide a system which avoids the wiring or telemetry for a control signal from the payload demodulator to the front end of the receiver.

Applicants' invention described herein overcomes the above problems.

SUMMARY OF THE INVENTION

In accordance with one embodiment of the present invention a communication system is provided wherein a receiver receives two pilot signals separated by a fixed frequency and utilizes the difference frequency from these two pilot signals to control the local oscillator frequency of the receiver.

In accordance with another embodiment of the present invention a point-to-multipoint communications system the point transmitter transmits a pilot signal to the remote multipoint receive stations and the remote receive stations utilize the received pilot signal to control the local oscillators of the receive stations.

In accordance with another embodiment of the present invention, in a point-to-multipoint communications system, the point transmitter transmit a pilot signal to the remote multipoint receive stations and the amplitude level of the received pilot signal is detected and used to control the gain of the received signal.

In accordance with another embodiment the detected amplitude levels is used to control the gain of the transmitted signal from the remote station.

These and other features of the invention that will be apparent to those skilled in the art from the following detailed description of the invention, taken together with the accompanying drawings.

DESCRIPTION OF PREFERRED EMBODIMENT

Figure 4:
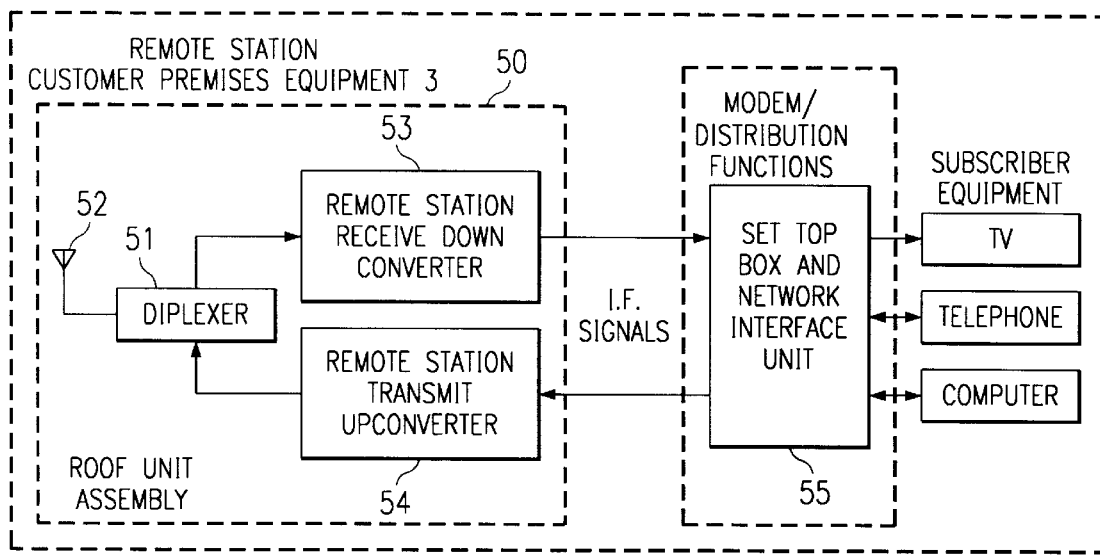
FIG. 4 illustrates a remote station function block diagram according to one embodiment of the present invention.

In accordance with one embodiment of the present invention a low cost method for creating a frequency reference is provided by a pilot signal and in addition, a pilot signal with amplitude independent of the payload signals set the remote station gain and provides a range estimate. The remote station RS may be like that illustrated in FIG. 4, which may include, for example, a roof unit assembly 50 with a diplexer 51 between the antenna 52 and remote station receive down converter 53 and the remote station up converter 54. The down converted signals are coupled to a set top box and network interface 55 for doing distribution functions to a television example or via the modem to telephone or computer functions. The signal output from the telephone or computer would be modulated onto an IF carrier sent through the interface modem distribution function box 55 to the up-converter 54 on the roof unit assembly, for example, which is then sent to the diplexer 51 to the antenna 52. The communications between a point base station BS and a remote station RS use as a frequency band as illustrated in FIG. 5 containing upstream payload carriers (1), down stream payload carriers (2), and one or more pilot tones (3)(4).

Figure 1:
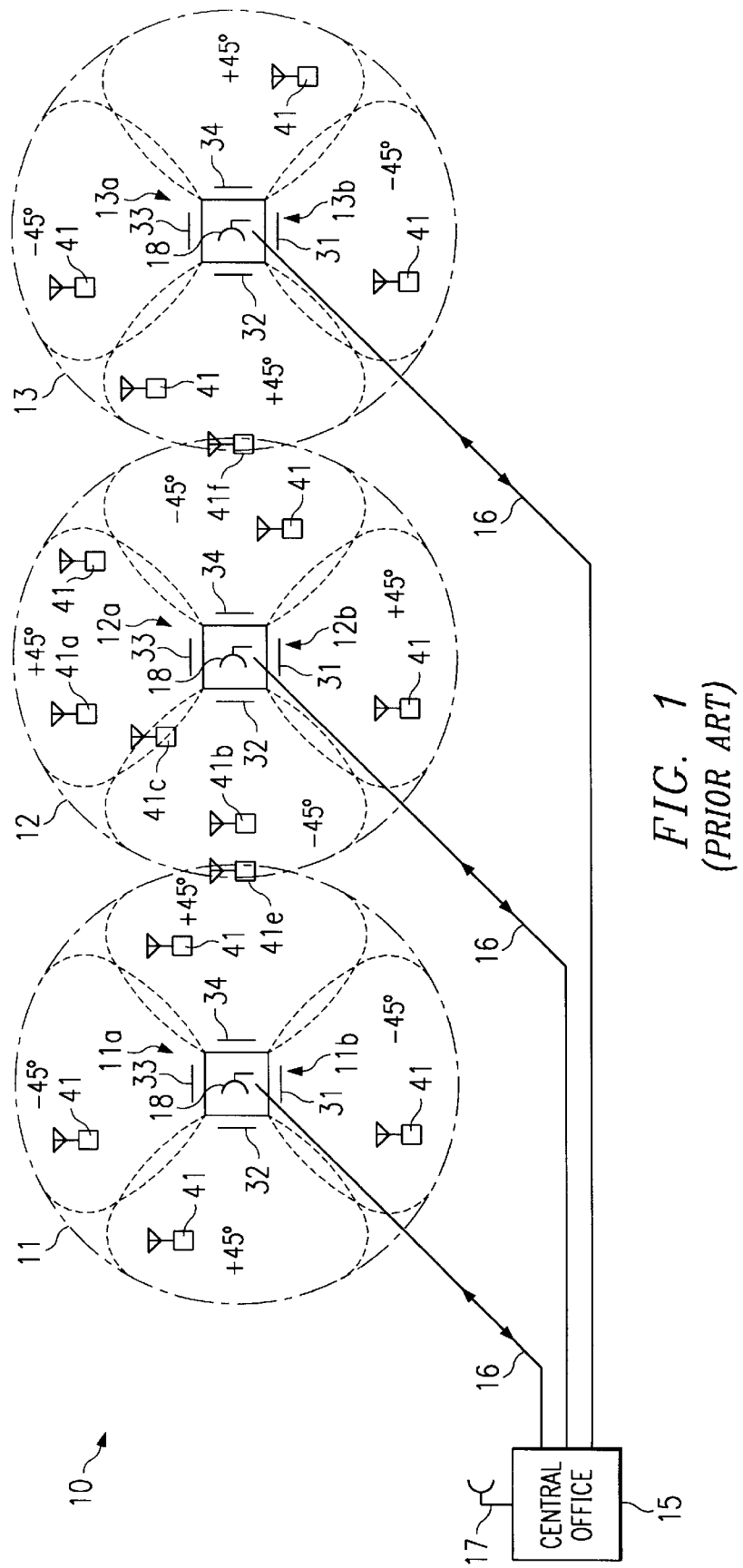
FIG. 1 illustrates a point-to-multipoint system.
Figure 2:
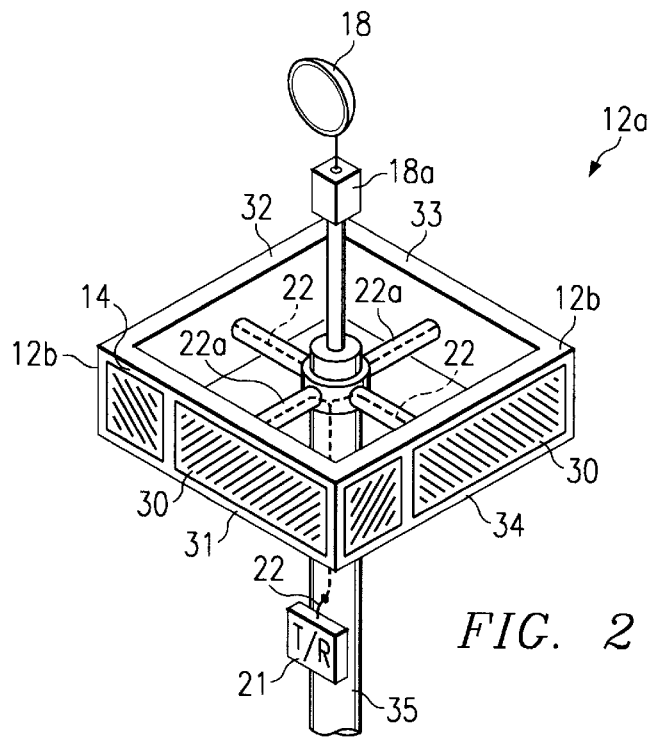
FIG. 2 illustrates a nodal broadcast system.
Figure 3:
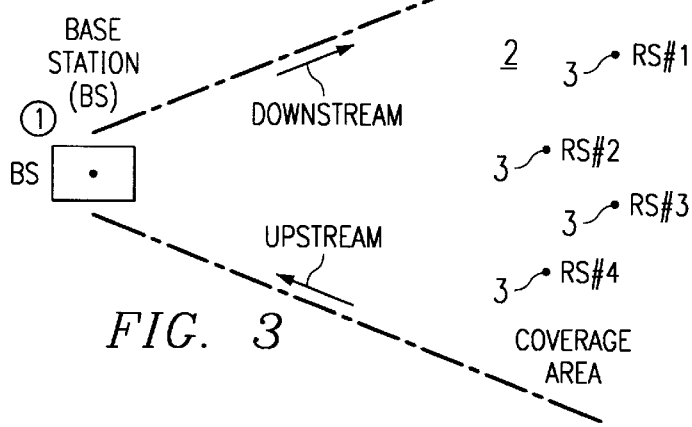
FIG. 3 illustrates a point-to-multipoint system showing a base station in communication with remote stations at a sector.
Figure 5:
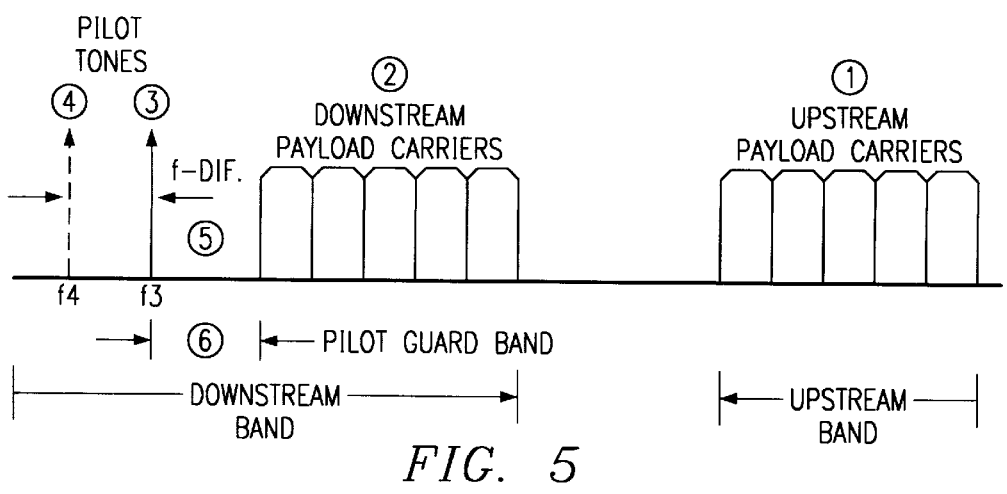
FIG. 5 is a spectrum plot showing upstream, downstream, and pilot tone signals.

As shown in FIG. 5, the invention uses a node base station (BS) to broadcast a reference pilot signal $f_3$ that synchronizes the frequency of the local oscillators (LO) in the remote stations (RS). As an option, the communications band can have additional pilot signal $f_4$. The frequency difference $f_3-f_4$ between two pilot signals can create reference signals with precise accuracy using simple circuitry. For example $f_3$ may be 28.1 GHz and $f_4$ may be 28 GHz leaving a 100 MHz difference signal. For the downstream path, base stations (BS) broadcast to remote stations (RS) in a point-to-multipoint protocol. For the upstream path, the remote station (RS) transmits to the base station BS. The downstream channels may be, for example, over frequency band 27.86 GHz to 28.50 GHz or 28.50 GHz to 29.5 GHz. The upstream operating, for example, over the frequency bands of 27.5–27.64 GHz or 29.38 to 29.5 GHz.

The pilot signal is positioned in frequency near the downstream carriers to allow common equipment (such as: transmitters, amplifiers, and antennas) to accommodate the pilot signal as well as the downstream payload carriers. The upstream and downstream signals are preferably at the same polarization in a given sector but may be at different orthogonal polarization. The pilot signal has a guard band (FIG. 5, Item 6) to keep interference from payload channels away from the pilot. The guard band allows remote station circuitry to use simple filters and frequency recovery loops. The accuracy of the reference signal has tight tolerances. For operation at say 28 GHz and with demodulators requiring payload carriers to be within 20 KHz, local oscillators require 0.7 parts-per-million frequency accuracy. Such oscillators are relatively expensive to implement without the use of a pilot signal.

Figure 6:
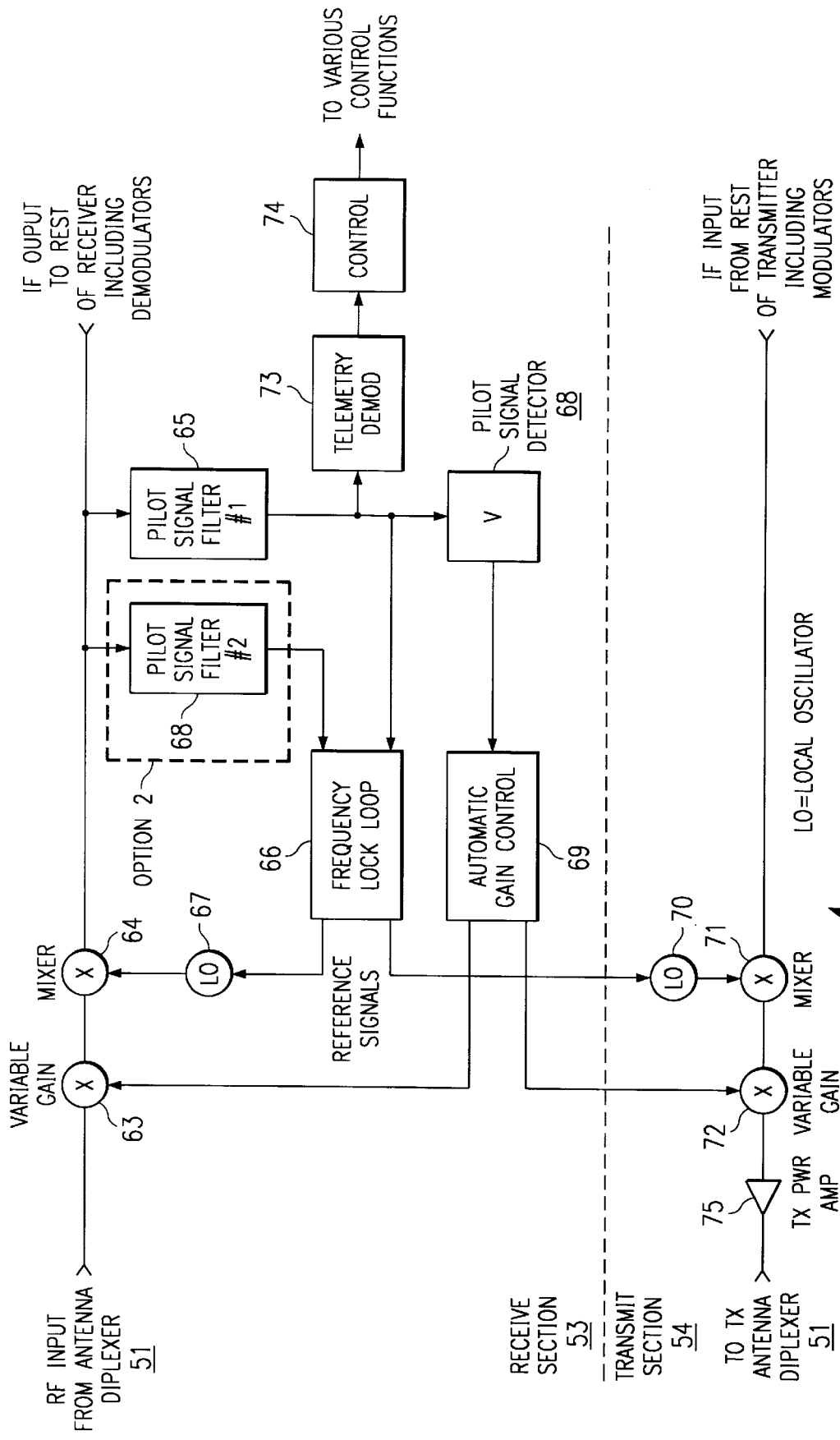
FIG. 6 is an example of a remote station roof unit receiver-down-converter and transmitter-up- converter showing the uses of pilot signal.
Figure 10:
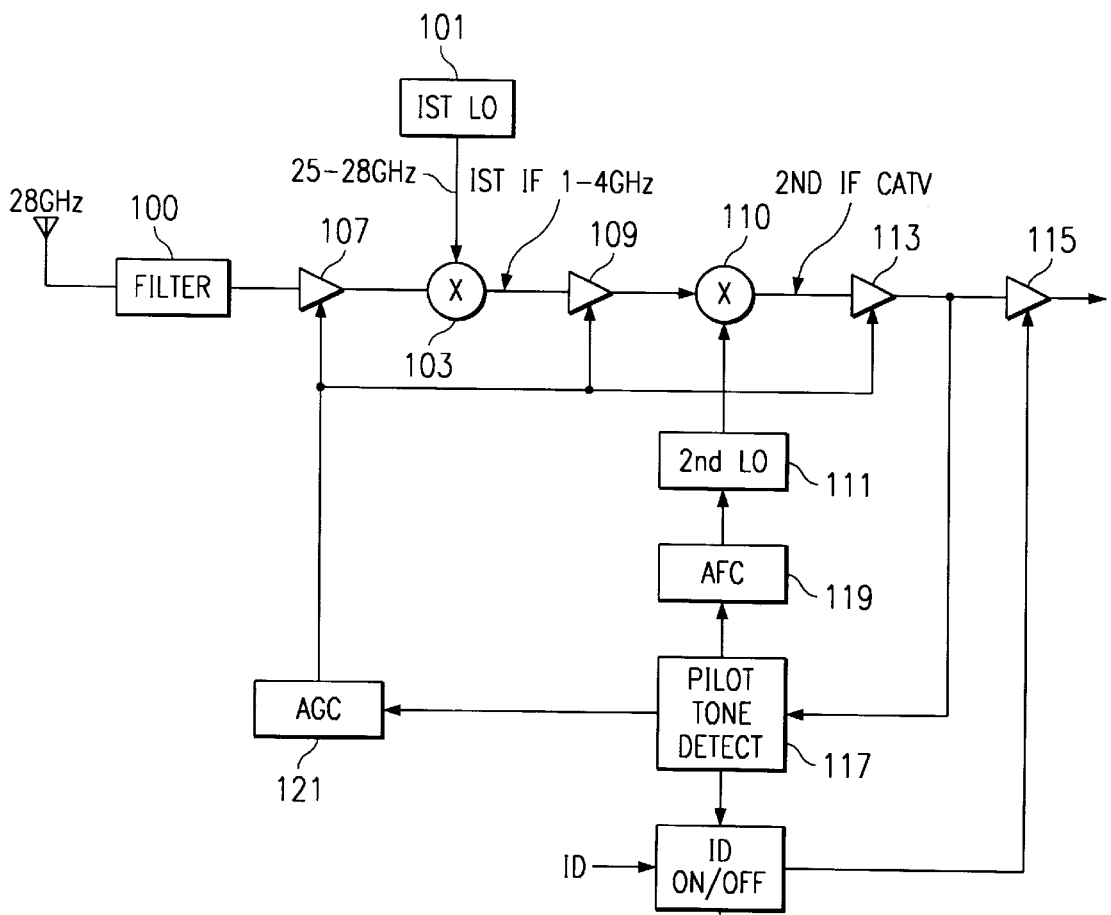
FIG. 10 illustrates a remote station receiver according to another embodiment where the pilot signal controls a second local oscillator.

Referring to FIG. 6, there is illustrated the remote station RS 60 receive section 53 and a transmit section 54. The receive section 61 contains a variable attenuator 63, a mixer 64, a first narrow band pilot signal filter 65 at 28.1 GHz, a frequency lock loop 66, a local oscillator 67, a second narrow band pilot signal detector 68 at 28 GHz, a telemetry receiver and demodulator 73, and an automatic gain control 69. The transmit section 54 contains a local oscillator 70 ($F_{transmit}=F_{IF}\pm F_{LO}$), a mixer 71, a variable attenuator 72 a transmit power amplifier 75, and transmit antenna 76. During receive operations, the polarized antenna input is applied through variable gain amplifier 63 to mixer 64 which translates the frequency of the incoming radio frequency (RF) (input frequency band) signal to an intermediate frequency (IF) signal such as L-band (950 MHz to 1950 MHz). The pilot signal filter 65 isolates the pilot signal from the downstream payload carriers. The frequency lock loop 66 generates a reference signal for the local oscillators 67 and 70. The frequency of the reference signal is a function of the pilot signal frequency (FIG. 10). The reference signal must be stable, be on a known frequency relative to the base station, and must have low phase noise.

Figure 7:
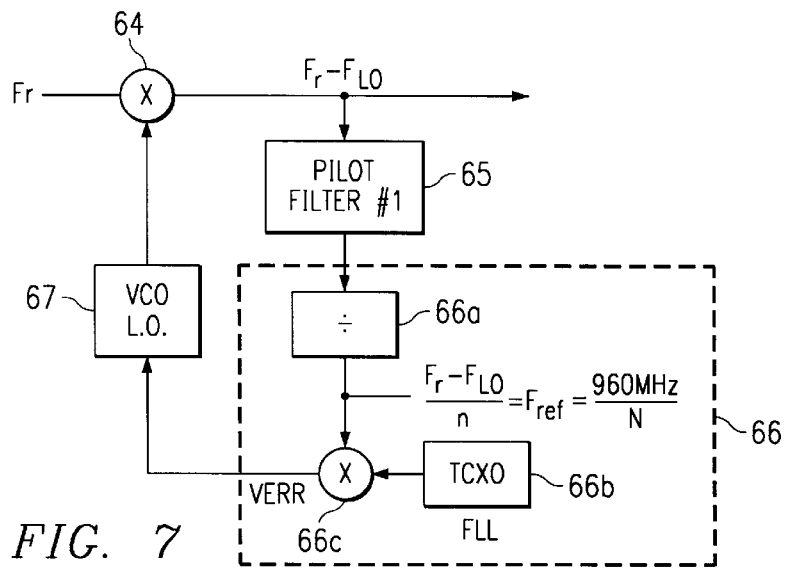
FIG. 7 illustrates one signal method of reducing frequency of uncertainty in accordance with one embodiment of the present invention.

In accordance with FIG. 7 there is illustrated the one tone method wherein the received frequency $F_r$ is mixed with the local oscillator frequency $F_{LO}$ at local oscillator (LO) 67 to produce a difference frequency $F_r-F_{LO}$ (960 MHz) which pilot signal (3) is divided by N at divider 66a to produce $$\frac{F_r - F_{LO}}{N}.$$

A stable crystal controlled oscillator frequency ($F_{ref}$= Approx.

$$\frac{F_r - F_{LO}}{N}$$

from the temperature compensated crystal oscillator(TCXO) 66b is subtracted by mixer 66c to get the voltage error $$Verr. = \frac{F_r - F_{LO}}{N} - F_{ref}.$$

This voltage error is applied to voltage controlled oscillator 67 to get the frequency LO. If Verr increases then $F_{LO}$ decreases which tends to keep $F_{LO}$ such that $F_r-F_{LO}$ equals precisely the pilot frequency (in this case 960 MHz).

Figure 8:
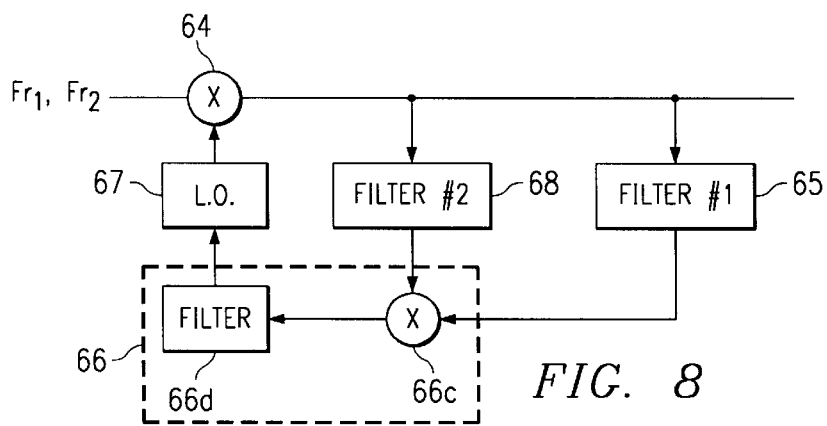
FIG. 8 illustrates a dual pilot signal method.

An option exists to use a second pilot signal (FIGS. 5 and 6, item 68) in place of a costly TCXO. The frequency difference between the signal 1 from filter 65 and signal 2 from filter 68 can simplify precise frequency determination circuitry (FIGS. 8). In accordance with the dual tone method of the system the base station transmitter BS sends downstream two pilot signals 3 and 4 at $F_{r1}$ and $F_{r2}$ respectively. The two receive pilot frequencies $F_{r1}$ and $F_{r2}$ are received at the mixer 64 and these signals at $F_{r1}-F_{LO}$ and $F_{r2}-F_{LO}$ are passed through the separate narrow band filters 65 and 68 to mixer 66c and a derived reference frequency $F_{ref}$ is the difference frequency which is equal to $(F_{r1}-F_{LO})-(F_{r2}-F_{LO})$ or $F_{r1}-F_{r2}$ which is filtered by low pass filter 66d which passes the $F_{ref}$ frequency. This difference frequency is then used to frequency lock the local oscillator 67 with the frequency input from the difference between the two pilot signals. The one filter 65 can, for example, pass 28.1 GHz and filter 68 pass 28 GHz for a 100 MHz difference signal.

The frequency lock loop circuit (FIG. 6, item 66) can also generate a reference signal for the transmit local oscillator (FIG. 6, item 70). For the upstream signals from the remote stations RS the modulated IF carrier signal is up converted at mixer 71. The local oscillator 70 frequency can use the same frequency lock loop 66 to control the transmit local oscillator 70. Therefore the downstream pilot signal or pilot signals controls the local oscillator for the upstream. It is anticipated that the IF frequency of the transmitter would be offset from the receive IF from mixer 64 to isolate the transmit RF from the receiver RF.

The pilot signal amplitude indicates receive signal strength. In the downstream path when an impairment such as rain occurs, then gain of the receive section 53 can be increased to compensate for time varying path loss. Remote station RS can use the pilot to set the gain of the receiver.

The pilot signal detector 78 (FIG. 6) detects the amplitude of the pilot signal. An automatic gain control (AGC) (FIG. 6) uses the detected pilot signal amplitude to set the attenuation level for the variable gain amplifier (FIG. 6, item 63). The AGC (FIG. 6, item 69) can control the drive level to the transmit amplifier (FIG. 6, item 75) with the Variable Gain (FIG. 6, item 72) and thus control the output power of the RS transmitter 54. The telemetry detector (FIG. 6, item 73) recovers modulation on the pilot signal at filter 65 and passes the bit stream to the telemetry control function (FIG. 6, item 74) The telemetry control can perform such functions as roof unit addressing or ON/OFF control. The mixer 64 output payload signals are passed on to the rest of the remote station RS receiver including the set top box and the subscriber equipment in the demodulators.

Figure 9:
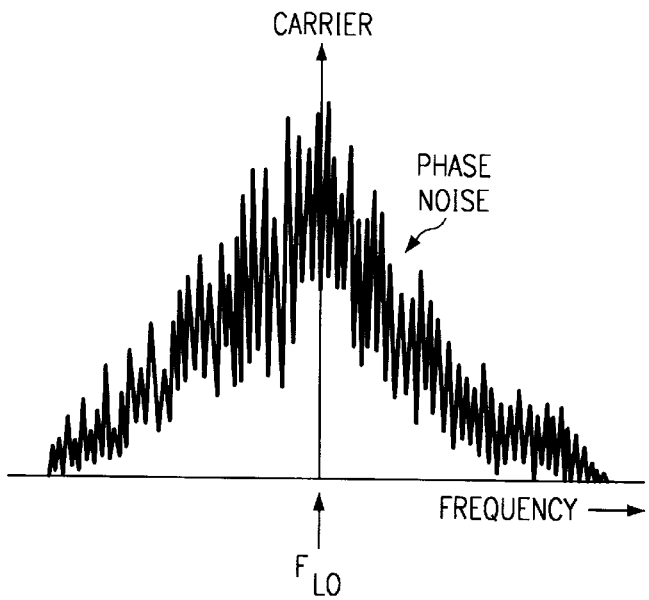
FIG. 9 illustrates a spectrum of local oscillator signal.

For proper operation of the demodulator, phase noise of the IF signal must be less than a specified level. Phase noise from the local oscillator contributes to the phase noise of the received signal. The spectrum of the local oscillator (FIG. 9) must be accurate in terms of frequency ($F_{LO}$) and phase noise. For digitally modulated payload carriers, the phase noise must be typically less that −90 dBc at 10 KHz from $F_{LO}$. Both the single and dual pilot tone approach produce a local oscillator signal that has a phase noise dominated by the phase noise of the pilot tone. Because the pilot tone generator is located at a single point at the base station, the expense of a high purity (low phase noise) pilot signal generator is insignificant to per subscriber's cost.

For a multi-carrier payload it is important that all carriers track the frequency of a master oscillator at the base station BS. The pilot signal allows all down and upstream payload carriers to track a single master oscillator located at the base station thus eliminating the chance for frequency differences between the payload carriers. By elementing reference frequency ($F_{ref}$) differences, more payload channels can be placed within a given operating band, because spectrum need not be used for frequency differences between channels.

The presence of a pilot signal enables transmission of the remote station. That is, if the remote station is not receiving a pilot signal (detected at detector 78) for whatever reason (such as pointing in the wrong direction) the remote station RS is not allowed to transmit. This blocking is at gain control 72 with a signal from gain control 69. If on the other hand the pilot tone is weak, the gain is increased to reach the base station and if the pilot tone is strong, the gain is reduced.

By placing the pilot signal separate from the payload carrier, the payload carriers can be turned off or changed in format without effecting the operation of the remote stations.

The pilot signal amplitude is also used to set the transmit power level of the remote station. A weak pilot signal causes the transmitter to increase power.

Applicants' utilize a pilot separated from payload carriers, one or more pilot tones broadcast to all remote stations, a pilot tone to synchronize the frequency of remote station LOs, a pilot tone as a low phase noise reference signal, a pilot tone at the signal strength indicator at a remote station, a pilot tone as a transmit interlock, and a pilot tone to send control telemetry to remote stations.

Referring to FIG. 10 another embodiment is illustrated where the controlled local oscillator is the second local oscillator. The received down stream RF signals are filtered at band pass filter 100 centered at 28 GHz, amplified at variable gain amplifier 107 and mixer 103 with a local oscillator 101 which is selected at for example 25 to 28 GHz to produce the first IF of, for example, 1 GHz may be 1–4 GHz dependent on the first local oscillator. The IF output is then amplified at amplifier 109 and mixed at second mixer 110 with the second local oscillator 111 output. The second IF signal from mixer 110 may be at the CATV frequency band (10 MHz to 1 GHz). The output from mixer 110 is amplified by amplifier 113 and amplifier 115 and applied to the rest of receiver containing the distribution and subscriber equipment as in FIG. 4. A pilot signal detector 117 is coupled to the output of amplifier 113 and includes a pilot signal filter and detector. The detected pilot frequency is used as discussed above with the Automatic Frequency Control Circuit (AFC) 119 to control the frequency of the second local oscillator 111 and the amplitude level is used to control the gain of amplifiers 107, 109, and 113 via the automatic gain control circuit 121. The identification ID control 23 may be used to require a password access to the received signals by modulating the pilot signal with telemetry.

Other Embodiments

Although the present invention and its advantages have been described in detail, it should be understood that various changes, substitutions and alterations can be made herein without departing from the spirit and scope of the invention as defined by the appended claims.

What is claimed is:

1. A point-to-multipoint communications system comprising:

a nodal transmitter transmitting alternating polarization payload signals at the same frequency band about a node; said nodal transmitter transmitting over each sector a pilot signal of the same polarization as the payload signals;

a plurality of transceivers located at multipoints about each sector each adapted to receive said pilot signal; and said transceivers responsive to said pilot signal for controlling the amplitude level of the incoming signal received at the multipoint transceiver and for controlling the amplitude level of the transmitted signal from the multipoint transceivers back to the nodal transmitter.

2. The system of claim 1 wherein said transceiver is responsive to said pilot signal for controlling the local oscillator frequency for both transmit and receive.

3. A point-to-multipoint communications system comprising: a nodal transmitter transmitting alternating polarization payload signals at the same frequency band about a node; said nodal transmitter transmitting over each sector a pair of pilot signals of the same polarization as the payload signals, said pilot signals separated by a fixed frequency;

a plurality of transceivers located at multipoints about each sector each adapted to receive said pilot signals; and said transceivers responsive to one of said pair of pilot signals for controlling the amplitude level of the incoming signal received at the multipoint transceiver and for controlling the amplitude level of the transmitted signal from the multipoint transceivers back to the nodal transmitter.

4. The system of claim 3 wherein said transceiver is responsive to said pair of pilot signals for controlling the local oscillator frequency for both transmit and receive.

* * * * *

UNITED STATES PATENT AND TRADEMARK OFFICE
CERTIFICATE OF CORRECTION

PATENT NO.    : 6,212,397 B1
DATED         : April 3, 2001
INVENTOR(S)   : James L. Langston, et al.

Page 1 of 1

It is certified that error appears in the above-identified patent and that said Letters Patent is hereby corrected as shown below:

<u>Title page,</u>
Item [60], under Related U.S. Application Data insert
-- Provisional Application No. 60/034,343 December 23, 1996. --

Signed and Sealed this

Twenty-third Day of October, 2001

*Attest:*

Nicholas P. Godici

NICHOLAS P. GODICI
*Attesting Officer*   *Acting Director of the United States Patent and Trademark Office*